United States Patent
Brott et al.

(10) Patent No.: US 7,409,856 B2
(45) Date of Patent: Aug. 12, 2008

(54) STARTING MOTOR TESTER THAT MEASURES POWER

(75) Inventors: Alejandro P. Brott, Chicago, IL (US); Dennis G. Thibedeau, Franklin, WI (US)

(73) Assignee: Snap-On Incorporated, Kenosha, WI (US)

( * ) Notice: Subject to any disclaimer, the term of this patent is extended or adjusted under 35 U.S.C. 154(b) by 37 days.

(21) Appl. No.: 11/434,109

(22) Filed: May 16, 2006

(65) Prior Publication Data

US 2007/0227237 A1    Oct. 4, 2007

(30) Foreign Application Priority Data

Mar. 30, 2006    (WO) ................. PCT/US2006/11774

(51) Int. Cl.
*G01M 15/00*    (2006.01)
(52) U.S. Cl. .................................... 73/119 R
(58) Field of Classification Search ............... 73/116, 73/117.2, 117.3, 118.1, 119 R
See application file for complete search history.

(56) References Cited

U.S. PATENT DOCUMENTS

| | | | |
|---|---|---|---|
| 3,870,954 A | * | 3/1975 | Hanson et al. .............. 324/772 |
| 4,816,768 A | | 3/1989 | Champlin |
| 6,438,487 B1 | * | 8/2002 | Mingo et al. ................ 701/113 |
| 7,024,859 B2 | | 4/2006 | Jayabalan et al. |
| 7,089,127 B2 | * | 8/2006 | Thibedeau et al. ............ 702/63 |
| 2004/0118194 A1 | * | 6/2004 | Raichle ..................... 73/118.1 |
| 2005/0012510 A1 | * | 1/2005 | Thibedeau et al. .......... 324/691 |
| 2006/0017450 A1 | * | 1/2006 | Thibedeau et al. .......... 324/705 |
| 2006/0031035 A1 | | 2/2006 | Brott et al. |

FOREIGN PATENT DOCUMENTS

| | | |
|---|---|---|
| EP | 0698795 A2 | 2/1996 |
| FR | 2833655 A | 6/2003 |
| GB | 2003281 A | 3/1979 |
| WO | WO2006/000498 A | 1/2006 |

* cited by examiner

*Primary Examiner*—Eric S McCall
(74) *Attorney, Agent, or Firm*—McDermott Will & Emery LLP

(57) ABSTRACT

A starting motor tester that may apply electricity to the starting motor while the starting motor is loaded by an engine, measure the power that is consumed by the starting motor while the starting motor is loaded by the engine, determine the condition of the starting motor based on the amount of power that is measured, and communicate the determined condition of the starting motor. The determination may also be based on the RPM of the engine.

14 Claims, 5 Drawing Sheets

STARTING MOTOR TESTER THAT MEASURES POWER

RELATED APPLICATIONS

This application claims priority from PCT Application No. PCT/US06/11774, filed on Mar. 30, 2006, which is incorporated herein by reference.

TECHNICAL FIELD

This specification relates to test equipment and, in particular, equipment that tests starting motors for engines.

BACKGROUND DESCRIPTION

Starting motors are commonly used to start engines by cranking them.

Starting motors may contain or develop defects. For example, a short may exist or develop in a winding of a starting motor. This can reduce the torque that the starting motor produces and cause the starting motor to draw excessive current. Mechanical problems may also develop, such as deterioration in a bushing. These mechanical problems can similarly cause a reduction in torque and excessive current to be drawn.

It may be difficult to detect defects in a starting motor, particularly without removing the starting motor from its installation. A reduction in torque or excessive current, for example, may not be apparent merely from observing and listening to the starting motor during operation. Even when it is, it may not be clear that the problem lies with the starting motor, as opposed to other components in the system (e.g., battery).

Current to the starting motor has in the past been measured as an indicia of its condition. However, this measurement often hinges upon the condition of its power source (e.g., battery), thus sometimes leading to ambiguous results.

Voltage to the starting motor has similarly been examined in the past as a means of assessing the condition of a starting motor. Again, however, this measurement often hinges on the condition of the power source (e.g., battery), again sometimes leading to ambiguous results. Further, a very powerful battery that is in good condition may mask a partially shorted starting motor from being detected by a voltage tester, as it may be able to sustain a high voltage level when driving the starting motor, even though the windings of the starting motor are partially shorted.

SUMMARY

A process for testing a starting motor may include applying electricity to the starting motor while the starting motor is loaded by an engine, measuring the power that is consumed by the starting motor while the starting motor is loaded by the engine, determining the condition of the starting motor based on the amount of power that is measured, and communicating the determined condition of the starting motor.

The process may include measuring the current though the starting motor, measuring the voltage that is applied to the starting motor, and determining the amount of power that is consumed by the starting motor based on the measured current and voltage. The process may include connecting apparatus that detects the current through the starting motor and connecting apparatus that detects the voltage on the starting motor.

The apparatus that detects the voltage may be connected to a connector on a battery post, and the amount of voltage that is applied to the starting motor may be measured by factoring in the loss of voltage between the battery and the starting motor.

The process may include receiving information indicative of the amount of power that the starting motor should consume, comparing the received information with the amount of power that is measured, and determining the condition of the starting motor based on the comparison.

The received information may include the size of the engine, and the process may include calculating the amount of power that the starting motor should consume based on the size of the engine.

The received information may include an identification of a vehicle in which the starting motor is mounted, and the process may include looking up the amount of power that the starting motor should consume in a database based on the identification of the vehicle.

The condition may be determined based on an average amount of power that is measured. The power may be measured after the electricity has been applied for at least one second.

The rotational speed of the engine may increase while the electricity is applied to the starting motor and then level off, and the power may be measured after the speed of the engine levels off.

The average amount of power may be measured after the speed of the engine levels off, and the condition of the starting motor may be determined based on the average amount of power that is measured.

The power consumed by the starting motor during at least one revolution of the engine may be measured.

The process may include measuring the rotational speed of the engine while electricity is applied to the starting motor and the condition of the starting motor may be determined also based on the measured rotational speed of the engine.

There may be a ripple in the electricity that is applied to the starting motor while the electricity is applied to the starting motor, and the process may include measuring the ripple. The rotational speed measurement may be based on the measured ripple. The process may include receiving the number of cylinders in the engine and the rotational speed measurement may also based on the number of cylinders.

The process may include measuring the temperature of the engine and the condition of the starting motor may be determined also based on the measured temperature of the engine.

The engine may be connected to an ignition system and the process may include disabling the ignition system before determining the condition of the starting motor.

A starting motor tester may include current measuring apparatus configured to measure current through the starting motor while the starting motor is loaded by an engine, voltage measuring apparatus configured to measure voltage on the starting motor while the starting motor is loaded by an engine, and a processing system. The processing system may be configured to receive measurements of current through the starting motor from the current measuring apparatus, receive measurements of the voltage on the starting motor from the voltage measuring apparatus, compute the power consumed by the starting motor based on the received measurements of current and voltage, determine the condition of the starting motor based on the amount of power that is computed, and communicate the determined condition of the starting motor.

The voltage measuring apparatus may be configured to attach to a connector on a battery post, and the processing system may be configured to factor in the loss of voltage between the battery and the starting motor when computing the power consumed by the starting motor.

The processing system may be configured to receive information indicative of the amount of power that the starting motor should consume, compare the received information with the amount of power that is computed, and determine the condition of the starting motor based on the comparison.

The processing system may be configured to receive information that includes the size of the engine and calculate the amount of power that the starting motor should consume based on the size of the engine.

The tester may include a memory configured to store a database and the processing system may be configured to receive an identification of a vehicle in which the starting motor is mounted and look up the amount of power that the starting motor should consume in the database based on the identification of the vehicle.

The processing system may be configured to determine the condition of the starting motor based on an average amount of power that is consumed by the starting motor.

The processing system may be configured to determine the condition of the starting motor based on an amount of power that is consumed by the starting motor after electricity has been applied to the starting motor for at least one second.

The processing system may be configured to determine the condition of the starting motor based on an amount of power that is consumed by the starting motor after electricity has been applied to the starting motor and the rotational speed of the engine levels off.

The processing system may be configured to determine when changes in the average amount of power consumed by the starting motor substantially cease and to determine the condition of the starting motor based on the amount of power that is consumed by the starting motor after the changes in the average amount of power substantially cease.

The processing system may be configured to determine the condition of the starting motor based on the average amount of power that is consumed by the starting motor during at least one revolution of the engine.

The tester may include engine rotational speed measuring apparatus configured to measure the rotational speed of the engine, and the processing system may be configured to determine the condition of the starting motor also based on the measured rotational speed of the engine.

The engine rotational speed apparatus may be configured to measure the ripple in electricity that is applied to the starting motor and to compute the rotational speed based on the ripple. The engine rotational speed apparatus may be configured to receive the number of cylinders in the engine and to compute the rotational speed also based on the number of cylinders.

The tester may include engine temperature measuring apparatus configured to measure the temperature of the engine and the processing system may be configured to determine the condition of the starting motor also based on the temperature of the engine.

The processing system may be configured to detect whether the ignition system has been disabled and to communicate that it has not been disabled when it has not.

A starting motor tester may include means for measuring current through the starting motor while the starting motor is loaded by an engine, means for measuring voltage on the starting motor while the starting motor is loaded by the engine, means for computing the power consumed by the starting motor based on the measurements of current and voltage, means for determining the condition of the starting motor based on the amount of power that is computed, and means for communicating the determined condition of the starting motor.

These, as well as still further features, objects, benefits, advantages, components, and steps will now become clear upon a review of the Detailed Description of Illustrative Embodiments and the accompanying drawings.

DETAILED DESCRIPTION

Figure 1:
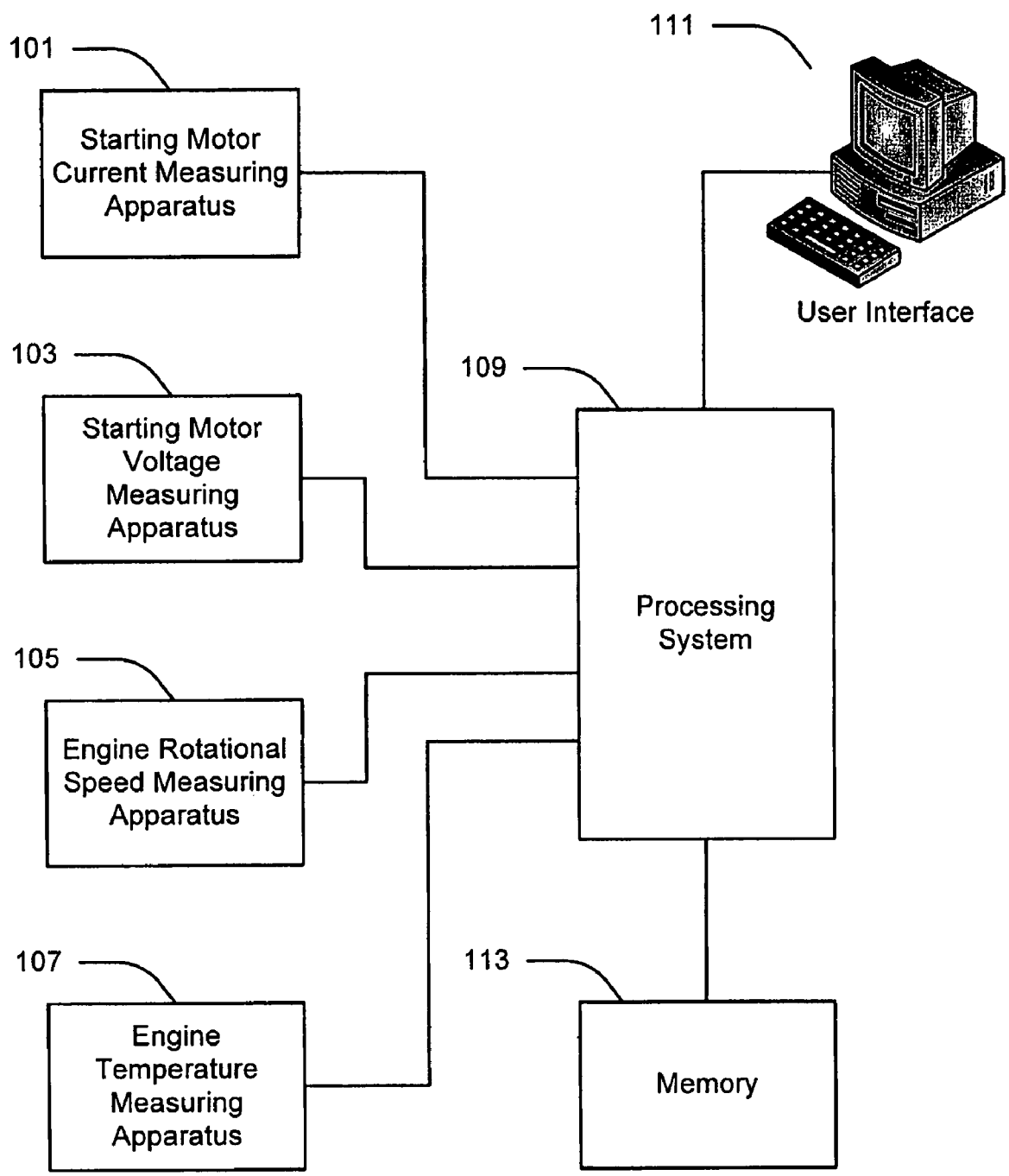
FIG. 1 is a block diagram of a starting motor tester.

FIG. 1 is a block diagram of a starting motor tester. As shown in FIG. 1, the tester may include a starting motor current measuring apparatus 101, a starting motor voltage measuring apparatus 103, an engine rotational speed measuring apparatus 105, and an engine temperature measuring apparatus 107, all of which may be configured to communicate with a processing system 109. The processing system 109 may be configured to communicate with a user interface 111 and a memory 113.

The starting motor current measuring apparatus 101 may be any type of apparatus that measures the current to a starting motor. It may include, for example, an amp probe that clamps onto a wire that supplies current to the starting motor. The probe may measure the magnetic field that is generated by the current traveling through the wire using one or more devices, such as a hall effect sensor.

The starting motor current measuring apparatus 101 may additionally or instead include a shunt device that is inserted in series with a current supply line to the starting motor. The voltage across the shunt may be measured and the current traveling through the starting motor may be computed based on the known resistance of the shunt and Ohm's law.

The starting motor current measuring apparatus 101 may additionally or instead include a device that measures the voltage drop across a battery when the current is delivered to the starting motor from the battery. Based on the known resistance of the battery, the current through the starting motor may again be calculated using Ohm's law.

Any other technique or apparatus for measuring current may also be used in addition or instead. For example, an amp meter may be inserted in series with the electrical connection to the starting motor.

The starting motor voltage measuring apparatus 103 may be any type of apparatus that measures the voltage across the starting motor. It may include a lead terminating in a spring-loaded clamp that may be clamped onto a terminal of the starting motor. This clamp may in addition or instead be configured to connect to the existing connector that is commonly used to attach a high current-carrying lead to the post of a battery. When the voltage to the starting motor is measured at the post of a battery, the starting motor voltage measuring apparatus 103 may be configured to compensate for the voltage drop between the battery post and the starting motor by subtracting this voltage drop from the measured voltage. The amount of this voltage drop may be determined by testing and/or by computing the expected drop based on the known resistance of the connecting cable, an average current and Ohm's law. Further details and other embodiments are set forth in U.S. Published patent application Ser. No. 10/909,367 (Publication No. 2006/0031035), entitled "Active Tester for Vehicle Circuit Evaluation," the entire content of which is incorporated herein by reference.

The engine rotational speed measuring apparatus 105 may be any type of apparatus that measures the rotational speed of an engine. It may include, for example, a tachometer. It may in addition or instead include a connector that connects to an existing ODB II connector in a vehicle, thus allowing this information to be extracted from an on-board system.

The engine rotational speed measuring apparatus 105 may in addition or instead monitor the voltage on a battery that supplies the starting motor and/or the current that travels from the battery to the starting motor. The rotational speed of the engine may then be computed from this voltage and/or current.

Figure 2:
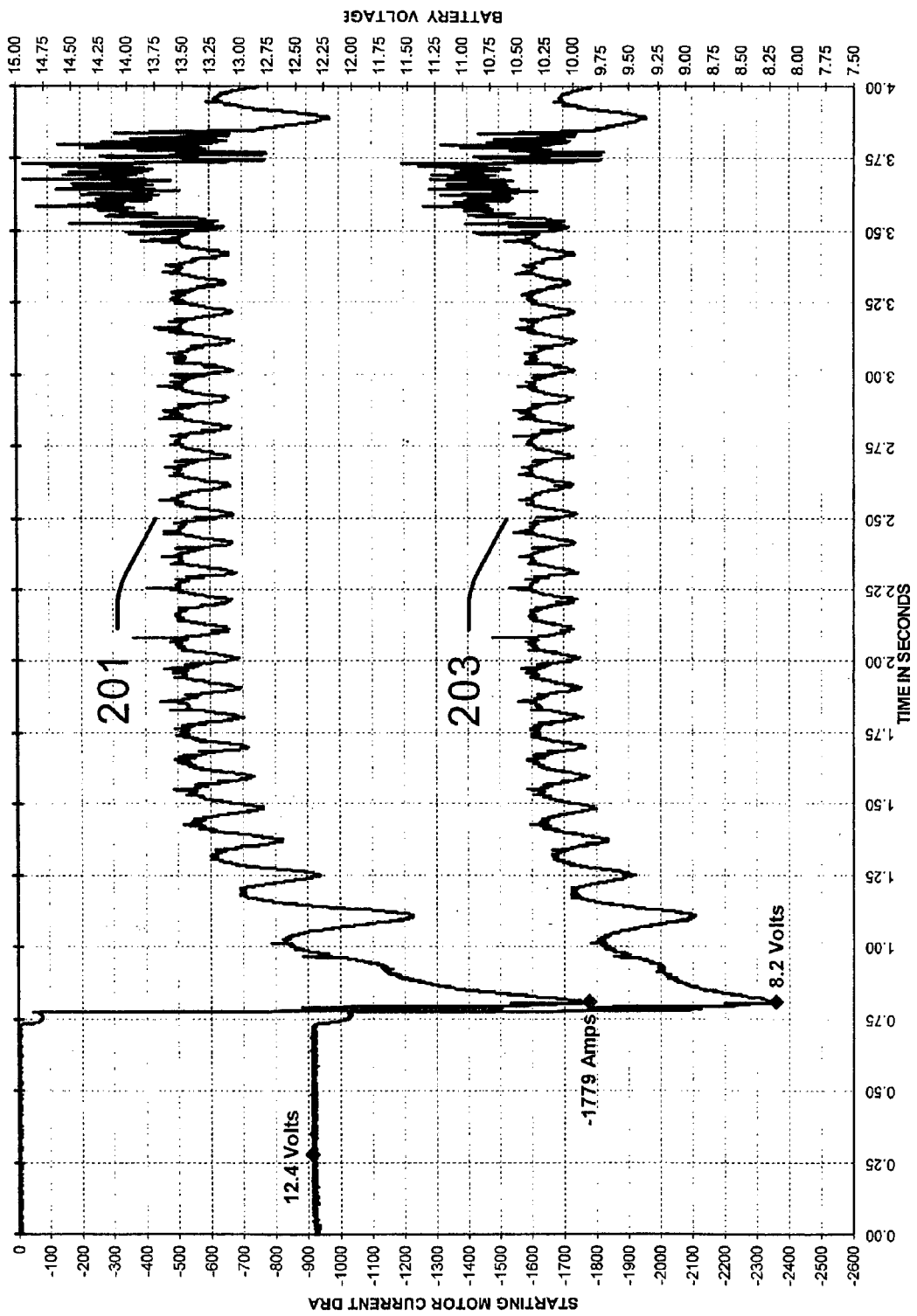
FIG. 2 shows traces of current traveling through a battery and voltage that the battery delivers before and after the output of the battery is delivered to a starting motor under load but with an ignition system disabled.

The process through which this rotational speed measurement may be computed from the voltage and/or current may be better understood by reference to FIG. 2. FIG. 2 shows traces of current and voltage that the battery delivers before and after the output of the battery is delivered to a starting motor under load but with an ignition system disabled. The current is illustrated by a current trace 201, while the voltage is illustrated by a voltage trace 203. As reflected by FIG. 2, the output of the battery may be delivered to the starting motor at approximately 0.8 seconds. Before this point in time, the current trace 201 may be at 0, while the voltage trace 203 may be at a maximum (e.g., approximately 12.4 volts). When the output of the battery is initially delivered to the starting motor at approximately 0.8 seconds, there may be a very high current in rush (e.g., approximately 1800 amps), and the voltage may drop to its lowest value (e.g., approximately 8.2 volts). Thereafter, the starting motor (as well as the engine) may begin to rotate. From approximately 0.8 seconds to approximately 1.5 seconds, the speed of the starting motor (and the engine) may increase. At approximately 1.5 seconds, the speed of the starting motor (and the engine) may level off.

Throughout the entire period when current is delivered to the starting motor, the starting motor current trace 201 and the starting motor voltage trace 203 may ripple. This ripple may be caused by compression strokes in the engine. As the engine rotates, the amount of resistance that it offers to rotation by the starting motor may be a function of the relative position of each compression stroke. The load becomes heaviest at the moment of greatest compression.

The actual rotational speed of the engine may be determined based on the frequency of the ripple in either the current trace 201 or the voltage trace 203 and the number of cylinders in the engine. More specifically, the engine RPMs may be calculated by multiplying the frequency (in hertz) of the ripple by 60, dividing the result by the number of cylinders in the engine, and multiplying the result by 2 (to compensate for the occurrence of compression only once every two crank shaft revolutions in a four stroke engine). The engine rotational speed measuring apparatus 105 may include apparatus to extract a ripple from the current trace 201 or the voltage trace 203 and to perform the needed computation, all using well-known techniques.

Returning now to FIG. 1, the engine temperature measuring apparatus 107 may include any type of apparatus to measure the temperature of the engine. It may include a temperature probe, a thermal couple, an infrared sensor, another type of measuring device, or any combination of these devices. The operator may in addition or instead enter the temperature through the user interface 111.

The processing system 109 may be any type of processing system or combination of processing systems. It may include a system that is dedicated to the functions of the starting motor tester (as described herein), a general purpose computer (e.g., a PC) that is programmed to perform the tester functions, a network of processing systems, or any combination of these. The processing system as well as other components of the starting motor tester may be housed in a small hand-held unit, such as a PDA. The processing system may be configured to perform the functions that are described in this specification using hardware, firmware, software, or any combination of these, all in accordance with well-known techniques. Although the processing system 109 is illustrated as being separate from the starting motor current measuring apparatus 101, the starting motor voltage measuring apparatus 103, the engine rotational speed measuring apparatus 105, and the engine temperature measuring apparatus 107, some or all of the functions performed by each of these apparatus may, in fact, be performed by the processing system and/or vice versa.

The user interface 111 may be any type of user interface. It may include a keyboard, a mouse, a printer, a loudspeaker, a display, a touch screen, or any combination of these. The user interface may be configured to perform the operations that are described in this specification, as well as other operations. The processing system 109 may additionally or instead be configured to communicate with other types of processing systems, such as with a PC or a network system.

The memory 113 may be any type of memory, including RAM, ROM, a CD or DVD and its associated player, a hard drive, any other type of memory device, or any combination of these. The memory 113 may be configured to store any type of information, such as the information discussed in this specification. For example, the memory 113 may be configured to store a database of starting motor kilowatt ratings. These ratings may specify the amount of kilowatts that one or more starting motors normally consume under load. The memory 113 may instead store minimum and maximum values for each starting motor under load. This information may be obtained by empirical testing, from starting motor manufacturers, from engine manufacturers, from vehicle manufacturers, by other means, or by any combination of these means. The kilowatt ratings of starting motors may be cross-referenced in the database to an identification of vehicles, such as to an identification of the make, year, and model of various vehicles. The database may be structured in accordance with well-known techniques to facilitate looking up the kilowatt rating (or range of ratings) for a starting motor, when all that is known is the make, model, and year of a particular vehicle.

The memory 113 may in addition or instead be configured to store a database of typical engine RPM ratings during cranking and/or minimum and maximum RPM ratings during cranking. This information may similarly be gathered from starting motor manufacturers, engine manufacturers, vehicle manufacturers, empirical testing, other means, or any combination of these means. This information may similarly be cross-referenced in the database using well-known techniques so as to facilitate the location of information about a particular engine when all that is known is the identification of the vehicle in which the engine has been installed, such as the model, make, and year of the vehicle.

The memory 113 may in addition or instead be configured to store information about the size of the engine that is connected to the starting motor.

The memory 113 may in addition or instead be configured to store one or more computer programs that work in conjunction with the processing system 109 to cause the processing system 109 to perform one or more of the functions described herein and/or other functions.

The processing system 109 may be configured to process information from the starting motor current measuring apparatus 101, the starting motor voltage measuring apparatus 103, the engine rotational speed measuring apparatus 105, and the engine temperature measuring apparatus 107, and to process information from and deliver information to the user interface 111 and the memory 113 so as to facilitate the operations and functions described in this specification, as well as others, all in accordance with well-established techniques.

Figure 3:
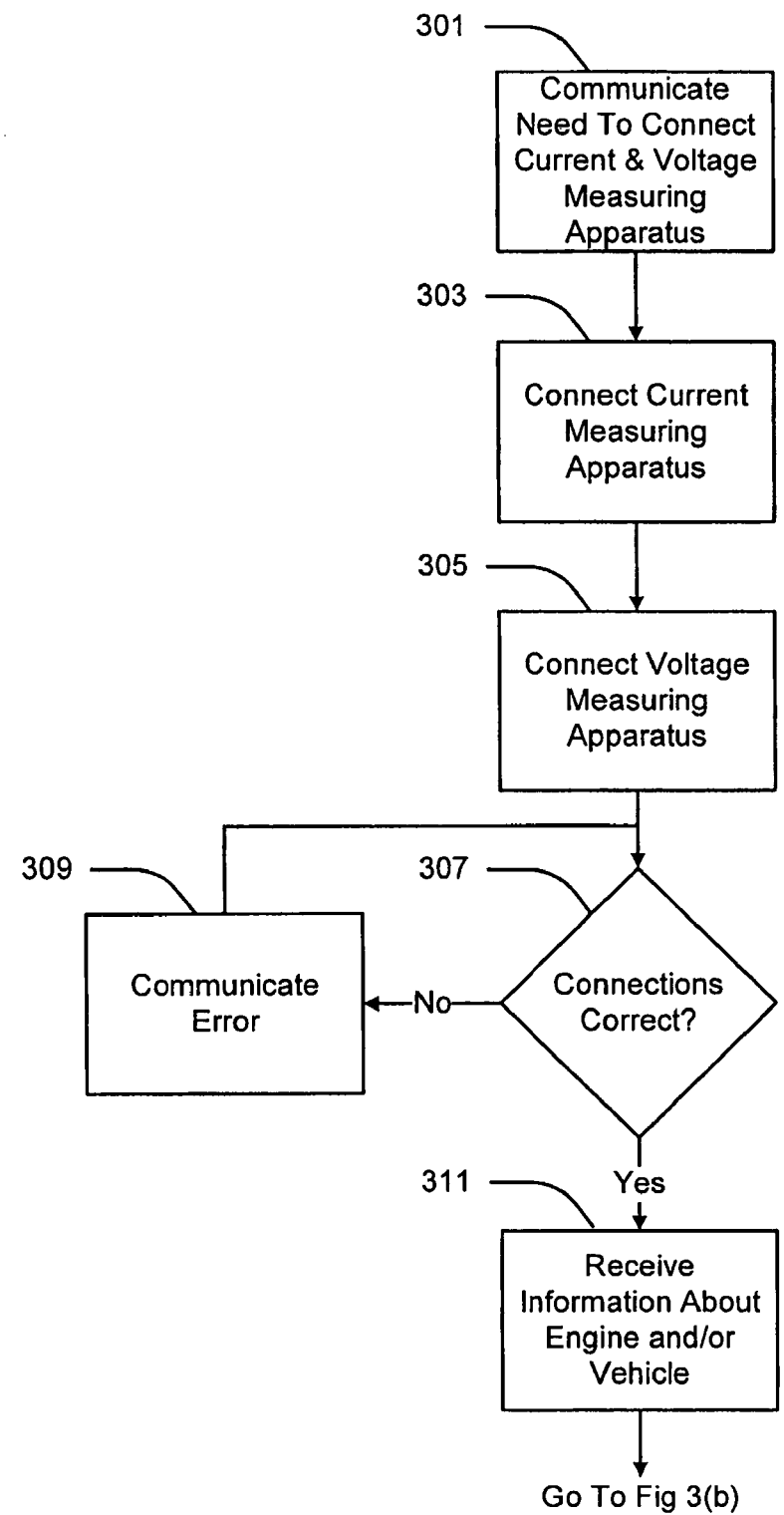
FIGS. 3(a)-(c) are flow charts of a process for testing a starting motor using the starting motor tester that is illustrated in FIG. 1.
Figure 3B:
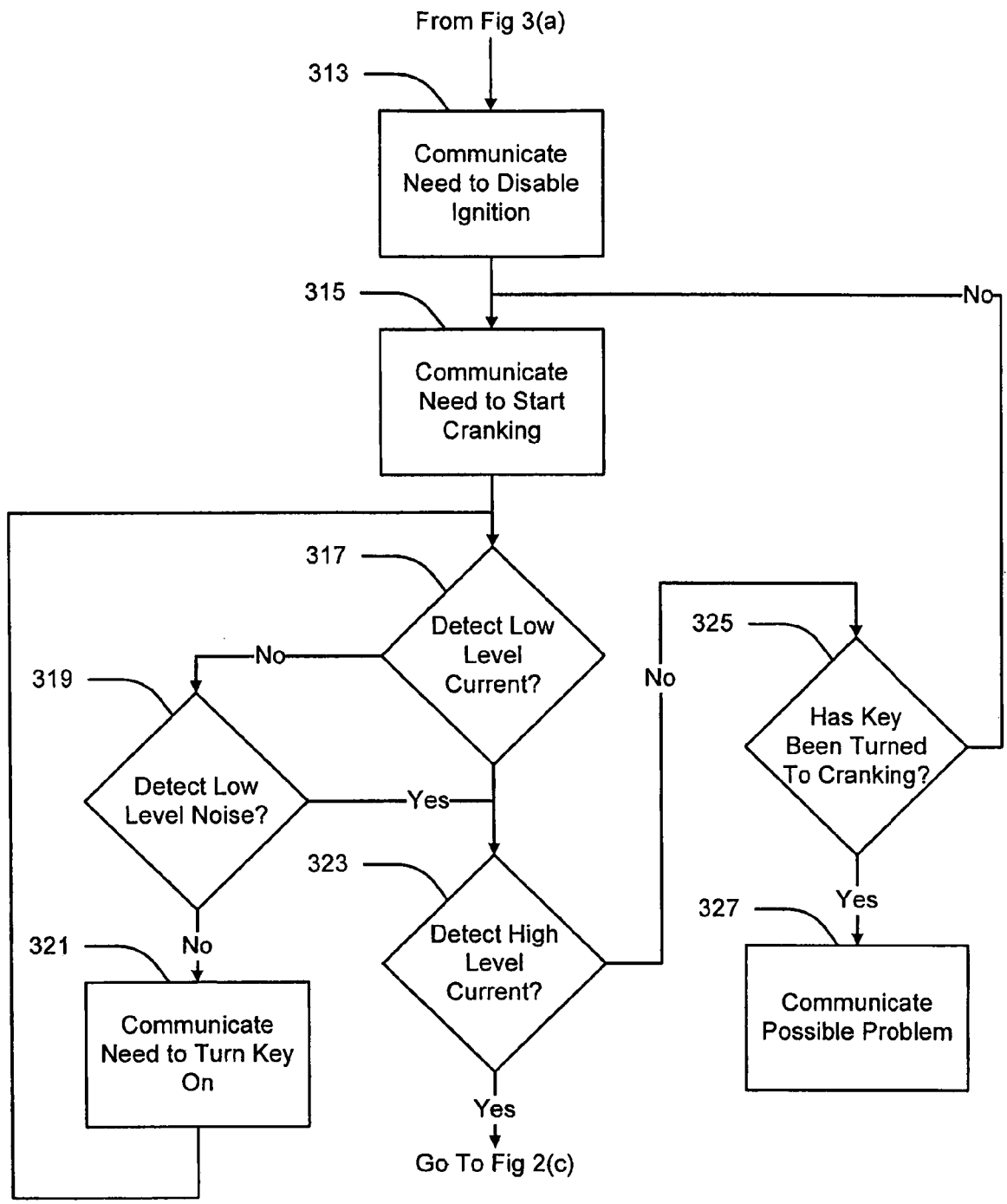
Figure 3C:
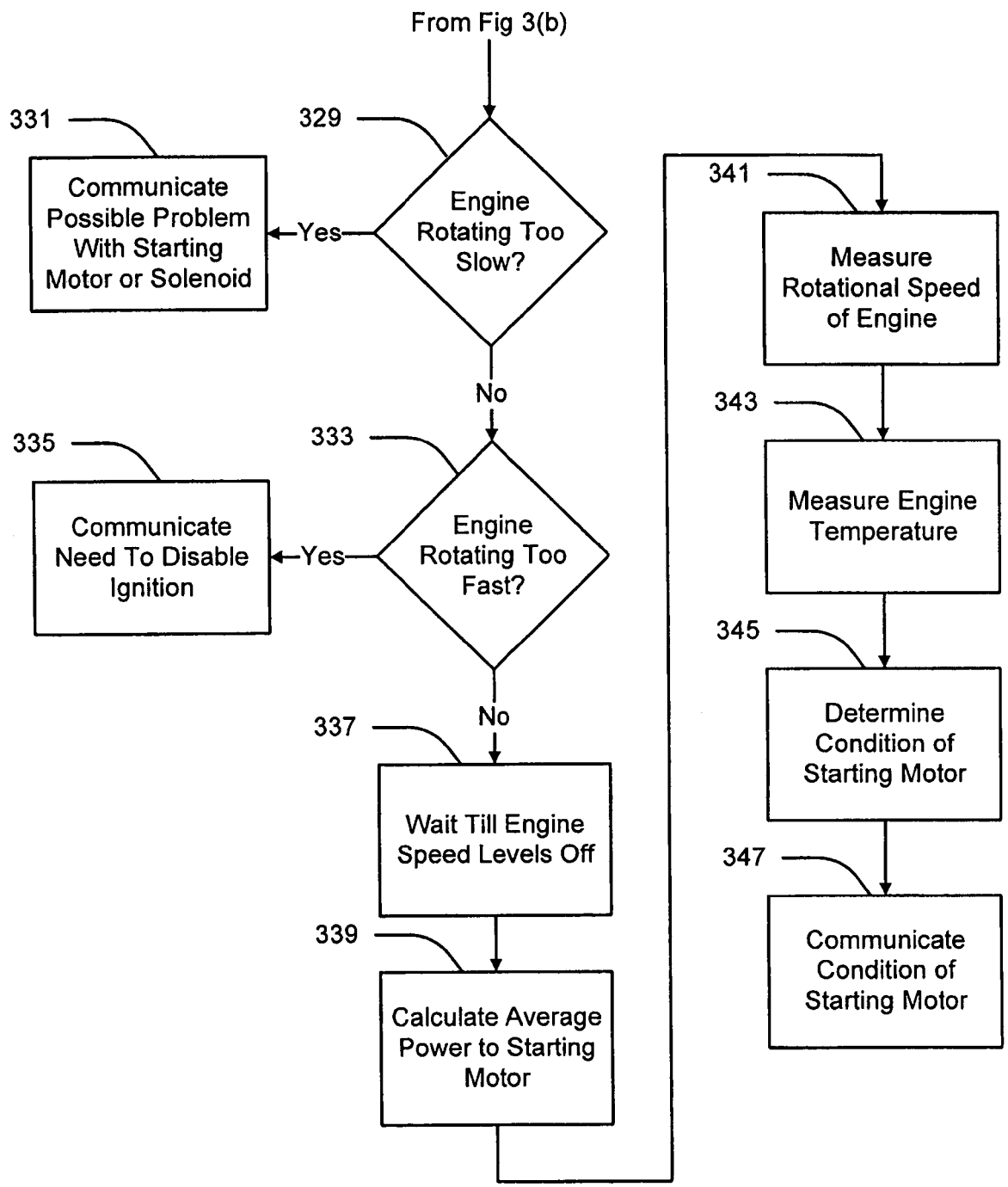

FIGS. 3(a)-(c) are flow charts of a process for testing a starting motor using the starting motor tester illustrated in FIG. 1. The process illustrated in FIGS. 3(a)-(c) may be performed in connection with any starting motor, including a starting motor that is installed in an engine and subject to the load of the engine when the starting motor is operating. The engine, in turn, may be any type of engine and may be installed in any type of system or vehicle, such as an automobile, a truck, a boat, a ship, a motorcycle, a generator, an airplane, or the like.

Although FIGS. 3(a)-(c) will now be discussed in connection with the starting motor tester illustrated in FIG. 1, the starting motor tester illustrated in FIG. 1 may be used to implement a broad variety of other processes. Similarly, the process illustrated in FIGS. 3(a)-(c) may be performed by a broad variety of other starting motor testers.

As shown in FIG. 3(a), the process may begin by the processing system 109 communicating to an operator of the test equipment through the user interface 111 that the starting motor current measuring apparatus 101 and the starting motor voltage measuring apparatus 103 should be connected, as reflected in a Communicate Need To Connect Current and Voltage Measuring Apparatus step 301. The operator may then connect the starting motor current measuring apparatus 101 and the starting motor voltage measuring apparatus 103, as reflected in a Connect Current Measuring Apparatus step 303 and a Connect Voltage Measuring Apparatus step 305, respectively.

The precise process of making the connections may depend upon the nature of the current and voltage measuring apparatus, examples of which have been discussed above. In one embodiment, both connections may be effectuated by connecting two leads across the terminals of a battery. As explained above, the voltage measurement may be adjusted by the starting motor voltage measuring apparatus 103 to compensate for the drop in voltage caused by the wires that connect the battery to the starting motor. The current through the starting motor may be calculated by measuring the voltage change across the battery when the starting motor is energized (in accordance with the process described below) and by calculating the current using the known resistance of the battery and Ohm's law. In another embodiment, the starting motor current measuring apparatus 101 may be connected by clamping a current probe around one of the leads to the starting motor.

The processing system 109 may next check whether the connections are correct, as reflected by a Connections Correct? decision step 307. The processing system may determine whether the starting motor voltage measuring apparatus 103 has been connected across a potential and, if so, whether the polarity is correct. If an error is detected, the error may be communicated to the operator by the processing system 109 through the user interface 111, as reflected by a Communicate Error step 309. The operator may then adjust the connection(s) and restart the tester, whereby the process may return to the Connections Correct? decision step 307.

If the connections are determined to be correct, the process may next prompt the operator to enter information about the engine and/or vehicle (not shown). The operator may then enter this information and it may be received, as reflected by a Receive Information About Engine and/or Vehicle step 311.

The exact type of information that is requested, entered, and received may depend upon the configuration of the starting motor tester and the process that it is configured to implement. In some embodiments, the make, year, and model of a vehicle may be entered, the number of cylinders in its engine, and/or the size of its engine. In other embodiments, additional or different types of information may be requested, entered, and received. This information may then be stored in the memory 113.

The operator may next be directed by the processing system 109 through the user interface 111 to disable the ignition in the vehicle, as reflected by a Communicate Need to Disable Ignition step 313. The operator, in turn, may then disconnect an ignition wire, thus preventing the vehicle from starting during the test that will be performed, or take other action to accomplish the same result. In other embodiments, this step may be omitted and the ignition system may be allowed to remain connected and active.

The operator may next be directed by the processing system 109 through the user interface 111 to start cranking the engine, as reflected by a Communicate Need to Start Cranking step 315. In response, the operator may put a key in an ignition system and rotate the key to a start cranking position.

The processing system 109 may next examine the measurement from the starting motor current measuring apparatus 101 to determine whether a low level of current is flowing into the starting motor, as reflected by a Detect Low Level Current? decision step 317. The processing system 109 may interpret such a low level of current as indicating that the operator has inserted and rotated the key to at least an "on" position.

The exact level of the low level current that is sought to be detected by the processing system 109 may vary. In one embodiment, the level may be 20 amps.

The Detect Low Level Current? decision step 317 may wait for a pre-determined period, such as for 30 seconds, to detect the required low level of current. This delay may be included to give the operator an opportunity to put the key in and turn it.

If the required low level of current is not detected by the processing system 109 by the end of the predetermined period, this may indicate that the operator has not inserted and turned the key. However, it may also indicate a problem with other parts of the system. To help determine which condition is present, the processing system 109 may next examine the current that is being measured by the starting motor current measuring apparatus 101 and/or the voltage that is being measured by the starting motor voltage measuring apparatus 103 to determine whether either contain a low level of noise, as reflected by a Detect Low Level Noise? decision step 319. A low level of noise usually indicates that a key has been inserted and turned on.

Determining whether there is a low level of noise may be accomplished by examining the amplitude and frequency of the noise. The required thresholds may vary depending upon the application. In one application, satisfaction of the low level noise test may require an amplitude of between 50 microvolts and 100 millivolts and a ripple frequency between 50 Hz and 5 KHz.

If a low level of noise is not detected, this may indicate that the key has not been inserted or turned. In this event, the processing system 109 may communicate through the user interface 111 that the operator needs to insert the key or turn it on, as reflected by a Communicate Need to Turn Key On step 321. The process may then pause to give the operator an opportunity to insert the key and turn it on, following which the process may return to step 317. If a low level of noise is still not detected, the system may communicate that there is a problem (not shown).

If the required low level of current is detected within the pre-determined period or a low level of noise is instead detected, this may indicate that the system is operating normally. In this event, the processing system 109 may next detect whether a high level of current is flowing, as reflected by a Detect High Level Current? decision step 323. The level required to indicate the high level current may vary depending upon the application. In one embodiment, the required level may be 300 amps.

The Detect High Level Current? decision step 323 may wait for a pre-determined period to detect the required high level of current. This delay may be set, such as for example at 5 seconds, to give the operator an opportunity to move the key from the on to the cranking position. If the required high level of current is not detected by the end of this pre-determined period, this may indicate that the operator has not turned the key to the ignition position or that something else is wrong. To help refine the nature of the problem, the processing system 109 may ask the operator through the user interface 111 whether the key has been turned to cranking, following which the operator may enter the answer through the user interface 111, all as reflected by a Has Key Been Turned To Cranking? decision step 325. If the operator answers "no," the operator may again be directed to start cranking, as reflected by a transfer of the process to the Communicate Need to Start Cranking step 315 and this portion of the process may repeat.

If the operator responds by indicating that the key has been turned to cranking, on the other hand, the processing system 109 may communicate through the user interface 113 that there may be a problem, as reflected by a Communicate Possible Problem step 327. At this point, there may be a problem with the starting motor, the starting motor solenoid, or another portion of the system, and the communication to the operator may so indicate.

If a high level of current is detected during the step 323, this may indicate that the starting motor is functioning properly. The processing system 109 may next examine the rotational speed of the engine, as reflected by an Engine Rotating Too Slow? decision step 329. This check may be made based on information provided by the engine rotational speed measuring apparatus 105.

If the engine is rotating too slowly, this may indicate a problem with the starting motor or solenoid. In this instance, the processing system 109 may communicate through the user interface 113 that there is such a problem, as reflected by a Communicate Possible Problem With Starting motor or Solenoid step 331.

The standard against which the engine speed is tested in step 329 may depend upon the particular application. In some applications, as explained above in connection with the memory 113, the starting motor tester may include a database of information about the expected rotational speed of the engine during cranking. In these embodiments, the processing system 109 may access this information in the memory 113 and compare it against the actual rotational speed, as measured by the engine rotational speed measuring apparatus 105. In other embodiments, the processing system 109 may be pre-programmed with a rotational speed, such as by the manufacturer of the tester or by the operator.

If the engine is not rotating too slowly, the processing system 109 may next determine whether the engine is rotating too fast, as reflected by an Engine Rotating Too Fast? decision step 333. This step may be performed for the purpose of determining whether the ignition has been disabled. If the ignition has not been disabled, the engine may begin rotating beyond the speed at which it can be driven by the starting motor. In this case, the processing system 109 may communicate over the user interface 113 that the ignition needs to be disabled, as reflected by a Communicate Need to Disable Ignition step 335. The operator may then disable the ignition and start the process again.

The standard for determining whether the engine is rotating too fast may, again, be based on information stored in the memory 113, in which event the processing system 109 may look this information up. In other instances, the information may be pre-programmed by the manufacturer of the tester or entered by the operator.

If the engine is not rotating too fast, the processing system 109 may delay further measurements until the speed of the engine levels off, as reflected by a Wait Until Engine Speed Levels Off step 337. As can be seen in FIG. 2 (discussed above), it may take a few seconds before the speed of the engine stabilizes. The processing system 109 may wait for a pre-determined amount of time, such as 2 seconds, with the expectation that this amount of time will enable the speed to stabilize. The processing system 109 may instead analyze the signal from the starting motor current measuring apparatus 101 and/or the starting motor voltage measuring apparatus 103 to determine when this plateau has been reached.

Once the engine speed has leveled off, the processing system 109 may calculate the power that is being delivered to the starting motor, as reflected by a Calculate Average Power to Starting motor step 339. To accomplish this, the processing system 109 may multiply the current, as measured by the starting motor current measuring apparatus 101, by the voltage, as measured by the starting motor voltage measuring apparatus 103. The processing system 109 may also average these measurements over a period, such as over a period of time or over a pre-determined number of engine rotations, such as over one rotation of the engine.

The processing system 109 may also at about this time measure the rotational speed of the engine, as reflected by a Measure Rotational Speed of Engine step 341. The processing system 109 may also at about this time measure the temperature of the engine, as reflected by a Measure Engine Temperature step 343.

The processing system 109 may next determine the condition of the starting motor, based on one or more of the measurements and calculations that have been made, as reflected by a Determine Condition of Starting motor step 345. There are numerous approaches that the processing system 109 may take in making this determination, some of which are now described.

In one embodiment, the processing system 109 may determine the condition of the starting motor based on the average power that was computed. It may determine, for example, whether the average power exceeds a threshold amount by a pre-determined percentage, such as by 20%. A different percentage may be used, depending on the application. The threshold against which the comparison is made may itself serve as the maximum amount.

Various techniques and approaches may be used to obtain the threshold amount. In one embodiment, the processing system 109 may access this value from the memory 113 based on the information about the vehicle that may have been entered. For example, if the make, model, and year of the vehicle were entered at step 311, the processing system 109 may search the memory 113 for the record that corresponds to this entered information and for the field of information in this record that specifies the power threshold value.

In another embodiment, the threshold value may be calculated based on the size of the engine that may have been entered by the operator in step 311. In this embodiment, an algorithm may be applied to the entered information about the size of the engine to compute the threshold value. For example, the threshold power value may be equated to a function of the engine's size, RPM and/or temperature. Empirical tests on engines of various sizes may be performed for the purpose of fine-tuning this algorithm, using well-known, curve-fitting techniques.

Other factors may in addition or instead be used by the processing system 109 in performing the Determine Condition of Starting motor step 345. For example, the rotational speed of the engine that was determined in the Measure Rotational Speed of Engine step 341 may be factored into the determination of the condition of the starting motor. A high rotational speed, for example, may be used as a factor that increases the threshold power value. Conversely, a low rotational speed may be used as a factor that decreases the threshold power value. A low rotational speed of the engine may also be interpreted by the processing system 109 as indicative of a starting motor problem, even though the average measured power to the starting motor is within normal limits.

Another factor that may be utilized by the processing system 109 in determining the condition of the starting motor is the engine temperature, as measured by the engine temperature measuring apparatus 107. A cold temperature, for example, may be used as a factor that increases the threshold power value. Conversely, a high temperature may be used as a factor that decreases the threshold power value.

In some systems, the processing system 109 may examine the engine temperature at or near the beginning of the process. If it is below a threshold value, the processing system 109 may direct the operator through the user interface 113 to warm the engine before proceeding further with the test. A re-check of the engine temperature may then be made before proceeding.

The determination that is made about the condition of the starting motor may then be communicated to the operator, as reflected by a Communicate Condition of Starting motor step 347. The communication may be through the user interface 113, such as to a display. The communication may instead or in addition use sound, such as a pre-recorded voice and/or a printer. The communication may in addition or instead be directed to another processing system, such as to a PC.

The content of the communication may vary. It may be a phrase such as "Starting motor Within Tolerance" or "Starting motor Not Within Tolerance." Phrases such as "Starting motor Defective" or "Starting motor OK" may be used in addition or instead. More detailed information may in addition or instead be included. For example, details about the particular measurements that were made may be communicated, including details about the measured and/or calculated current, voltage, power, rotational speed, and/or temperature. One or more of these may be in textual and/or graphical form. Traces, like the traces shown in FIG. 2, may also be included. The communications initiated by the processing system 109 may include communications about the condition of other components in the system, such as about the starting motor relay and/or the battery. The condition of these other components may be determined based on the tests that have been performed, as well as other tests that may be performed, all in accordance with existing knowledge.

The starting motor testers and testing processes that have been described may be included or utilized with any appropriate voltage or current source, such as a voltage of about 12, 24 or 42 volts.

The starting motor testers and testing processes that have been described may be used with any desired system or engine. These may comprise systems or engines utilizing fossil fuels, such as gasoline, natural gas, propane and the like, electricity, such as that generated by battery, magneto, fuel cell, solar cell and the like, wind and hybrids, or combinations thereof. Those systems or engines may be incorporated into other systems, such as an automobile, a truck, a boat or ship, a motorcycle, a generator, an airplane, and the like.

The components, steps, features, objects, benefits, and advantages that have been discussed are merely illustrative. None of them, nor the discussions relating to them, are intended to limit the scope of protection in any way. Numerous other embodiments are also contemplated, including embodiments that have fewer, additional, and/or different components, steps, features, objects, benefits, and advantages. The components and steps may also be arranged and ordered differently.

For example, the starting motor tester illustrated in FIG. 1 need not necessarily include all of the components shown in FIG. 1, such as the engine rotational speed measuring apparatus 105, the engine temperature measuring apparatus 107, the memory 113, and/or the user interface 111. The starting motor tester may also include additional components not shown in FIG. 1 or discussed above.

Similarly, the process need not include all of the steps that are illustrated in FIGS. 3(a)-(c), may include additional steps, and may include steps in a different sequence. For example, the process may not communicate so many messages to the operator or it may communicate more messages. The process may not test for correct connections, may not test for either low or high current levels, may not test for low noise levels, and/or may not test to determine whether the engine is rotating too slowly or too fast.

In a still further embodiment, the starting motor tester and process may not direct the operator to disable the ignition or to require that the ignition be disabled as part of the process. Instead, the starting motor tester and process may perform all of its analyses during the very early stages of the cranking process, before the engine becomes powered by the normal ignition process. In this embodiment, the starting motor may never have the opportunity to come up to full speed before rotation of the engine is taken over by the ignition process. In this circumstance, the processing system 109 may be configured to extrapolate the steady-state starting motor current, starting motor voltage, and engine RPMs that would have occurred but for the ignition. The processing system 109 may perform this extrapolation from the data that is received prior to the ignition of the engine and may use this extrapolated information in the analysis of the condition of the starting motor.

In a still further embodiment, one or more or all of the components of the starter tester may be part of the vehicle in which the starting motor is mounted. When only some of the components are part of the vehicle, the components outside of the vehicle may connect to the components inside of the vehicle through a data link connector (DLC) to the vehicle, such as through an OBD II connector.

In short, the scope of protection is limited solely by the claims that now follow. That scope is intended to be as broad as is reasonably consistent with the language that is used in the claims and to encompass all structural and functional equivalents. Nothing that has been stated or illustrated is intended to cause a dedication of any component, step, feature, object, benefit, advantage, or equivalent to the public, regardless of whether or not it is recited in the claims.

The phrase "means for" when used in a claim embraces the corresponding structure and materials that have been described and their equivalents. Similarly, the phrase "step for" when used in a claim embraces the corresponding acts that have been described and their equivalents. The absence of either phrase means that the claim is not limited to any corresponding structures, materials, or acts.

What is claimed is:

1. A process for testing a starting motor comprising:
applying electricity to the starting motor while the starting motor is loaded by an engine;
measuring the current through the starting motor while the starting motor is loaded by an engine;
measuring the voltage that is applied to the starting motor while the starting motor is loaded by an engine;
determining the amount of power that is consumed by the starting motor based on the measured current and voltage;
determining the condition of the starting motor based on the amount of power that is determined; and
communicating the determined condition of the starting motor,
wherein: an apparatus detects the voltage and is connected to a connector on a battery post; and the amount of voltage that is applied to the starting motor is measured by factoring in the loss of voltage between the battery and the starting motor.

2. A process for testing a starting motor comprising:
applying electricity to the starting motor while the starting motor is loaded by an engine;
measuring the power that is consumed by the starting motor while the starting motor is loaded by the engine;
receiving information indicative of the amount of power that the starting motor should consume;
comparing the received information with the amount of power that is measured;
determining the condition of the starting motor based on the comparison; and
communicating the determined condition of the starting motor,
wherein the received information includes the size of the engine; and the process includes calculating the amount of power that the starting motor should consume based on the size of the engine.

3. A process for testing a starting motor comprising:
applying electricity to the starting motor while the starting motor is loaded by an engine;
measuring the power that is consumed by the starting motor while the starting motor is loaded by the engine;
receiving information indicative of the amount of power that the starting motor should consume;
comparing the received information with the amount of power that is measured;
determining the condition of the starting motor based on the comparison; and
communicating the determined condition of the starting motor,
wherein: the received information includes an identification of a vehicle in which the starting motor is mounted; and the process includes looking up the amount of power that the starting motor should consume in a database based on the identification of the vehicle.

4. A process for testing a starting motor comprising:
applying electricity to the starting motor while the starting motor is loaded by an engine;
measuring the power that is consumed by the starting motor while the starting motor is loaded by the engine;
measuring the rotational speed of the engine while electricity is applied to the starting motor;
determining the condition of the starting motor based on the amount of power that is measured and the measured rotational speed of the engine; and
communicating the determined condition of the starting motor,
wherein: there is a ripple in the electricity that is applied to the starting motor while the electricity is applied to the starting motor; the process includes measuring the ripple; and the rotational speed measurement is based on the measured ripple.

5. The process of claim 4 further comprising receiving the number of cylinders in the engine and wherein the rotational speed measurement is also based on the number of cylinders.

6. A process for testing a starting motor comprising:
applying electricity to the starting motor while the starting motor is loaded by an engine;
measuring the power that is consumed by the starting motor while the starting motor is loaded by the engine;
determining the condition of the starting motor based on the amount of power that is measured; and
communicating the determined condition of the starting motor,
receiving the temperature of the engine and wherein the condition of the starting motor is determined also based on the measured temperature of the engine.

7. A process for testing a starting motor comprising:
applying electricity to the starting motor while the starting motor is loaded by an engine;
measuring the power that is consumed by the starting motor while the starting motor is loaded by the engine;
receiving information indicative of the amount of power that the starting motor should consume;
comparing the received information with the amount of power that is measured;
determining the condition of the starting motor based on the comparison amount of power that is measured; and
communicating the determined condition of the starting motor, wherein the engine is connected to an ignition system and the process includes disabling the ignition system before determining the condition of the starting motor.

8. A starting motor tester comprising:
current measuring apparatus configured to measure current through the starting motor while the starting motor is loaded by an engine;
voltage measuring apparatus configured to measure voltage on the starting motor while the starting motor is loaded by an engine; and
a processing system configured to:
receive measurements of current through the starting motor from the current measuring apparatus;
receive measurements of the voltage on the starting motor from the voltage measuring apparatus;
compute the power consumed by the starting motor based on the received measurements of current and voltage;
determine the coAdition of the starting motor based on the amount of power that is computed; and
communicate the determined condition of the starting motor,
wherein: the voltage measuring apparatus is configured to attach to a connector on a battery post; and the processing system is configured to factor in the loss of voltage between the battery and the starting motor when computing the power consumed by the starting motor.

9. A starting motor tester comprising:

current measuring apparatus configured to measure current through the starting motor while the starting motor is loaded by an engine;

voltage measuring apparatus configured to measure voltage on the starting motor while the starting motor is loaded by an engine; and a processing system configured to:

receive measurements of current through the starting motor from the current measuring apparatus;

receive measurements of the voltage on the starting motor from the voltage measuring apparatus;

compute the power consumed by the starting motor based on the received measurements of current and voltage;

receive information indicative of the amount of power that the starting motor should consume;

compare the received information with the amount of power that is computed; and determine the condition of the starting motor based on the comparison, and communicate the determined condition of the starting motor, wherein the processing system is configured to: receive information that includes the size of the engine; and calculate the amount of power that the starting motor should consume based on the size of the engine.

10. A starting motor tester comprising:

current measuring apparatus configured to measure current through the starting motor while the starting motor is loaded by an engine;

voltage measuring apparatus configured to measure voltage on the starting motor while the starting motor is loaded by an engine; and a memory configured to store a database a processing system configured to:

receive measurements of current through the starting motor from the current measuring apparatus;

receive measurements of the voltage on the starting motor from the voltage measuring apparatus; compute the power consumed by the starting motor based on the received measurements of current and voltage;

receive information indicative of the amount of power that the starting motor should consume;

compare the received information with the amount of power that is computed;

determine the condition of the starting motor based on the comparison, and communicate the detennined condition of the starting motor, and wherein the processing system is configured to: receive an identification of a vehicle in which the starting motor is mounted; and look up the amount of power that the starting motor should consume in the database based on the identification of the vehicle.

11. A starting motor tester comprising:

current measuring apparatus configured to measure current through the starting motor while the starting motor is loaded by an engine;

voltage measuring apparatus configured to measure voltage on the starting motor while the starting motor is loaded by an engine;

engine rotational speed measuring apparatus configured to measure the rotational speed of the engine; and a processing system configured to:

receive measurements of current through the starting motor from the current measuring apparatus;

receive measurements of the voltage on the starting motor from the voltage measuring apparatus;

compute the power consumed by the starting motor based on the received measurements of current and voltage;

determine the condition of the starting motor based on the amount of power that is computed and the measured rotational speed of the engine; and communicate the determined condition of the starting motor, wherein the engine rotational speed apparatus is configured to measure the ripple in electricity that is applied to the starting motor and to compute the rotational speed based on the ripple.

12. The tester of claim 11 wherein the engine rotational speed apparatus is configured to receive the number of cylinders in the engine and to compute the rotational speed also based on the number of cylinders.

13. A starting motor tester comprising:

current measuring apparatus configured to measure current through the starting motor while the starting motor is loaded by an engine;

voltage measuring apparatus configured to measure voltage on the starting motor while the starting motor is loaded by an engine; and a processing system configured to:

receive measurements of current through the starting motor from the current measuring apparatus;

receive measurements of the voltage on the starting motor from the voltage measuring apparatus;

compute the power consumed by the starting motor based on the received measurements of current and voltage;

determine the condition of the starting motor based on the amount of power that is computed; and communicate the determined condition of the starting motor, engine temperature measuring apparatus configured to measure the temperature of the engine and wherein the processing system is configured to determine the condition of the starting motor also based on the temperature of the engine.

14. A starting motor tester comprising:

current measuring apparatus configured to measure current through the starting motor while the starting motor is loaded by an engine;

voltage measuring apparatus configured to measure voltage on the starting motor while the starting motor is loaded by an engine; and a processing system configured to:

receive measurements of current through the starting motor from the current measuring apparatus;

receive measurements of the voltage on the starting motor from the voltage measuring apparatus;

compute the power consumed by the staffing motor based on the received measurements of current and voltage;

determine the condition of the staffing motor based on the amount of power that is computed; and communicate the determined condition of the staffing motor, wherein the processing system is configured to detect whether the ignition system has been disabled and to communicate that it has not been disabled when it has not.

* * * * *